(12) United States Patent
Drake

(10) Patent No.: US 6,746,193 B1
(45) Date of Patent: Jun. 8, 2004

(54) CLIP ASSEMBLY FOR USE WITH RACK-MOUNTED EQUIPMENT

(75) Inventor: James Robert Drake, Burlington, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/713,364

(22) Filed: Nov. 15, 2000

(51) Int. Cl.[7] ............................. F16B 37/04; A47F 5/00
(52) U.S. Cl. ......................... 411/175; 211/26; 211/182
(58) Field of Search .................................. 411/174, 175, 411/111, 112; 211/182, 26

(56) References Cited

U.S. PATENT DOCUMENTS

| | | | | |
|---|---|---|---|---|
| 2,278,790 A | * | 4/1942 | Langmaid | |
| 2,394,729 A | * | 2/1946 | Tinnerman | |
| 2,633,886 A | * | 4/1953 | Tinnerman | |
| 2,681,679 A | | 6/1954 | Poupitch | |
| 2,875,805 A | | 3/1959 | Flora | |
| 3,126,039 A | | 3/1964 | Fiddler | |
| 3,138,187 A | | 6/1964 | Jaworski | |
| 3,783,922 A | | 1/1974 | Petrus | |
| 4,375,933 A | * | 3/1983 | Hassler | |
| 5,172,608 A | * | 12/1992 | Schultz | |
| 6,230,903 B1 | * | 5/2001 | Abbott | |
| 6,270,281 B1 | * | 8/2001 | Ruusuvuori | |

* cited by examiner

*Primary Examiner*—Flemming Saether
(74) *Attorney, Agent, or Firm*—Sawyer Law Group

(57) ABSTRACT

A device for use with rack-mounted equipment is disclosed. The device comprises a threaded portion and a clip element coupled to the threaded portion whereby the device is capable of being utilized in conjunction with a plurality of rack configurations. Through the use of the present invention, both square-hole and round-hole rack configurations can be accommodated with one device. This results in a significant reduction in the cost of computer/rack-mounted equipment.

7 Claims, 7 Drawing Sheets

CLIP ASSEMBLY FOR USE WITH RACK-MOUNTED EQUIPMENT

FIELD OF INVENTION

The present invention relates generally to rack-mounted computer assemblies and more specifically to a device for use with rack-mounted equipment.

BACKGROUND OF THE INVENTION

Rack-mounted computer assemblies are typically utilized throughout the computer industry. FIG. 1 shows a conventional rack-mounted computer assembly configuration. The configuration comprises a first railing portion 10 and a second railing portion 11 directly opposite the first railing portion 10. The railing portions are coupled to a rack 12 wherein a computer assembly 14 is slidably mounted within the railing portions 10, 11.

Currently there are two types of rack mounting implementations, a square-hole implementation and a round-hole implementation. FIG. 2(a) shows the square-hole implementation 20. The square-hole implementation 20 includes a rack 12' wherein the rack 12' includes a plurality of square holes 26. Each of the plurality of square holes 26 are for receiving a nut assembly 21. The nut assembly 21 comprises a nut 22 wherein the nut 22 is attached to a coupling element 24. The coupling element 24 comprises locking elements 25 for locking the nut assembly 21 to the rack 12' when coupling the nut assembly 21 to the rack 12' as shown.

Please refer now to FIG. 2(b). FIG. 2(b) shows the round-hole implementation 50. The round-hole implementation 50 includes a rack 12" wherein the rack 12" includes a plurality of round holes 58. Each of the plurality of round holes 58 are for receiving a nut assembly 51. The nut assembly 51 comprises a nut 54 wherein the nut 54 is attached to a mounting clip 52. The mounting clip 52 also includes circular apertures 53, 56. (Not shown in the figure is a flange element that acts as a positioner when the assembly 51 is utilized in conjunction with the round-hole implementation 50.) Accordingly, the nut assembly 51 is clipped to the rack 12" as shown thereby allowing threaded fasteners to be utilized to couple computer equipment to the rack 12".

Because computer manufacturers utilize both square-hole and round-hole type rack configurations, both types of nut assemblies 21, 51 must be supplied with computer products/rack mounted equipment in order to properly accommodate each type of rack configuration. Consequently, whichever type of nut assembly that is not needed, is subsequently discarded. This is an extremely wasteful process.

Therefore, what is needed is a device that accommodates both types of configurations. The device should be simple, cost effective and capable of being easily adapted to current technology. The present invention addresses such a need.

SUMMARY OF THE INVENTION

A device for use with rack-mounted equipment is disclosed. The device comprises a threaded portion and a clip element coupled to the threaded portion whereby the device is capable of being utilized in conjunction with a plurality of rack configurations.

Through the use of the present invention, both square-hole and round-hole rack configurations can be accommodated with one device. This results in a significant reduction in the cost of computer/rack-mounted equipment.

DETAILED DESCRIPTION OF THE INVENTION

The present invention provides a device for use with rack mounted equipment. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiments shown but is to be accorded the widest scope consistent with the principles and features described herein.

The present invention is presented in the context of a preferred embodiment. The preferred embodiment of the present invention is a device for use with rack mounted equipment. The device in accordance with the present invention preferably comprises a threaded assembly that can be utilized with both square-hole and round-hole type rack configurations. Consequently, the use of the device in accordance with the present invention eliminates the wasteful process of having to supply two types of nut-assemblies in order to accommodate both types of rack configurations.

Figure 1:
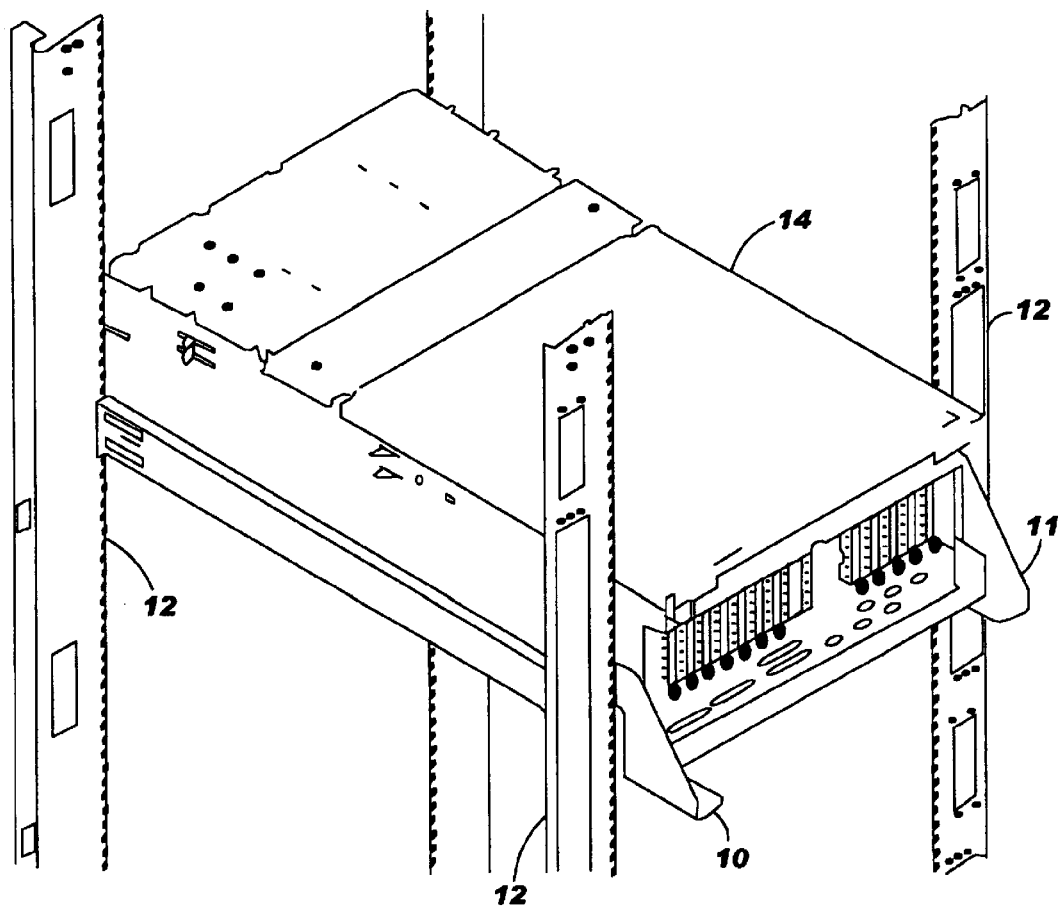
FIG. 1 shows a conventional rack-mounted computer assembly configuration.
Figure 2A:
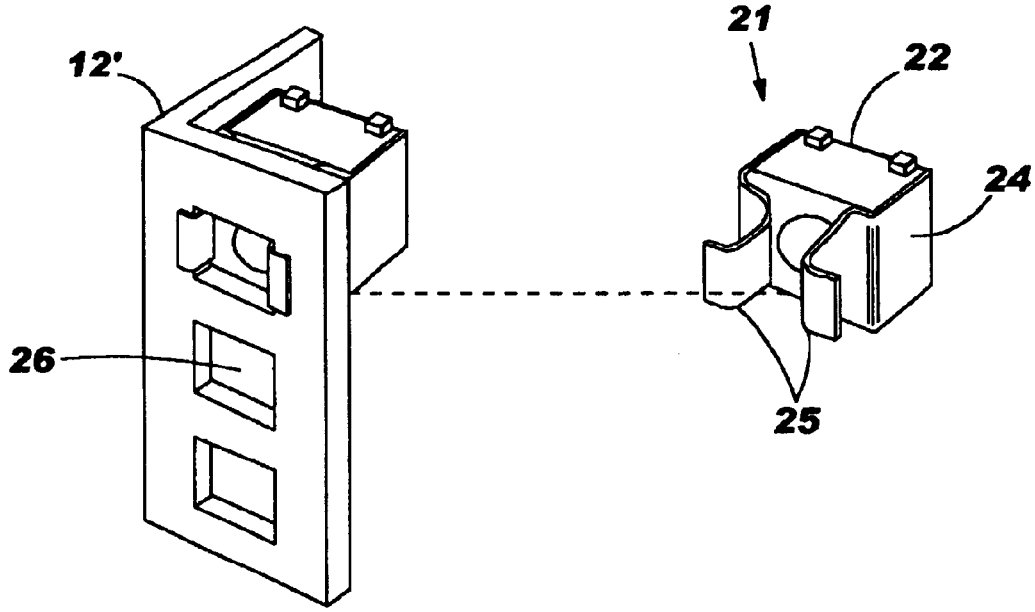
FIG. 2(a) shows the square-hole implementation.
Figure 2B:
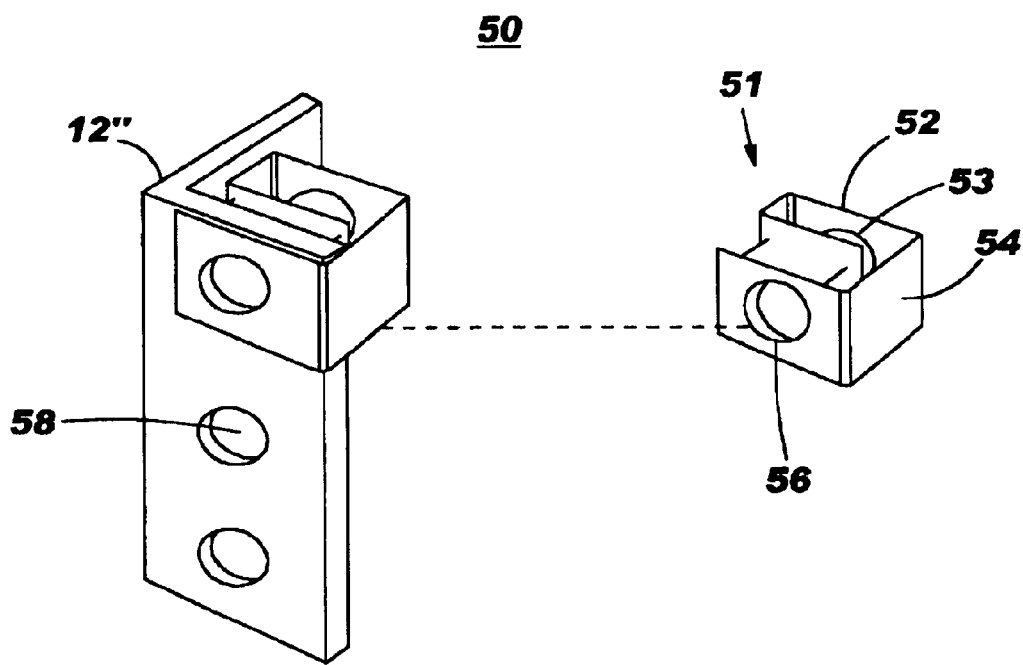
FIG. 2(b) shows the round-hole implementation.
Figure 3:
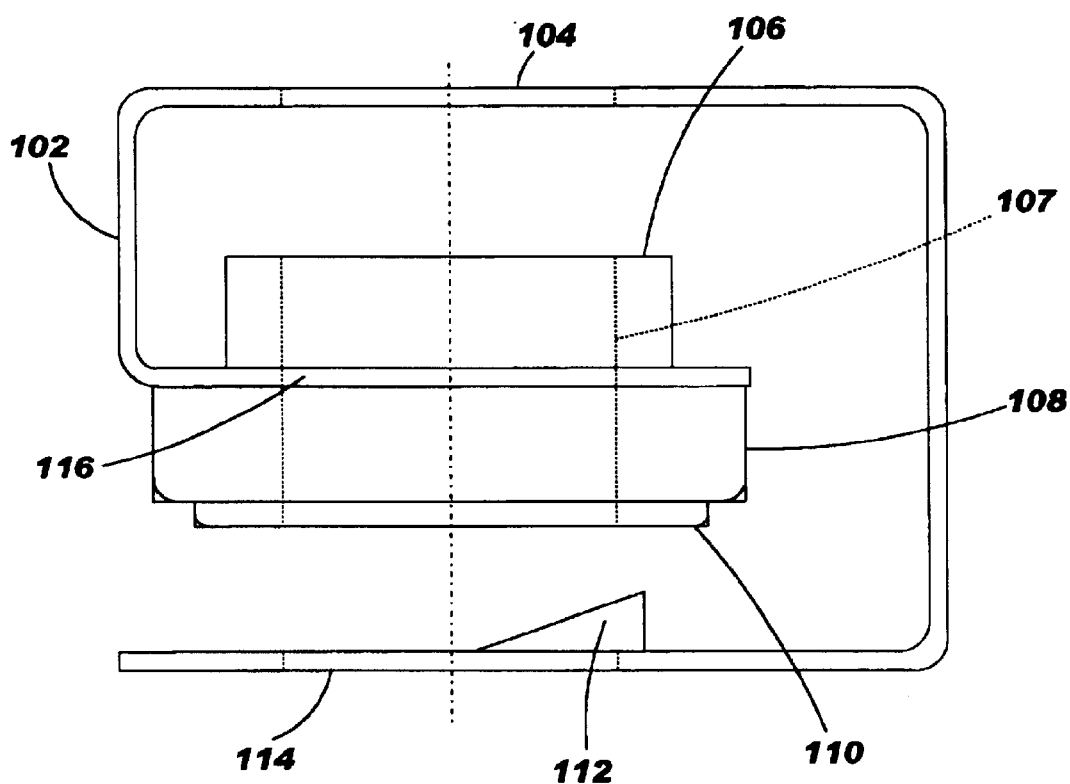
FIG. 3 is a top perspective view of the threaded assembly in accordance with the present invention.

For a better understanding of the present invention, please refer now to FIG. 3. FIG. 3 is a top perspective view of the threaded assembly 100 in accordance with the present invention. The assembly 100 comprises a clip element 102 wherein the clip element 102 includes posterior aperture 104, anterior aperture 114 and central aperture 116 wherein the anterior aperture 114 includes a flange element 112. The assembly 100 further comprises a threaded portion 107 wherein the threaded portion 107 comprises three threaded elements: a back portion 106, a shoulder surface 108, and a locating surface 110.

Figure 4:
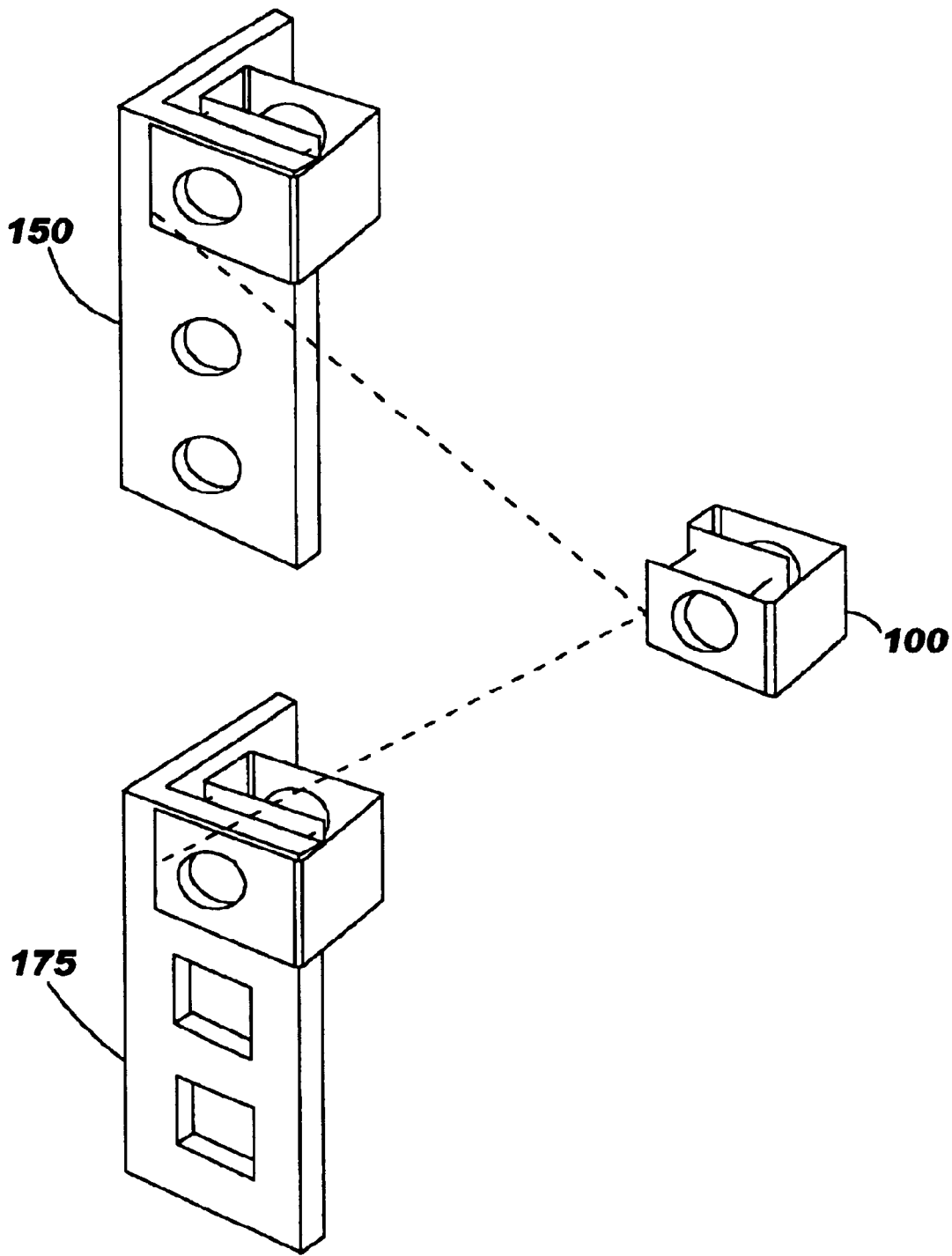
FIG. 4 shows the assembly in accordance with the present invention being coupled to a round-hole configuration and a square-hole configuration.

The back portion 106 and the shoulder surface 108 are coupled to the clip element 102 as shown. The locating surface 110 is preferably square shaped and is coupled to the shoulder surface 108. The back portion 106, the shoulder surface 108 and the locating surface 110 each include threaded holes whereby each of the threaded holes makes up the threaded portion 107. The locating surface 110 is designed to fit snugly into the square-hole configuration and acts as a positioner when the assembly 100 is utilized in conjunction with a square-hole rack configuration. Also, the flange element 112 acts as a positioner when the assembly 100 is utilized in conjunction with the round-hole rack configuration. As a result, the assembly 100 can be utilized in conjunction with both round-hole and square-hole rack configurations. FIG. 4 shows the assembly 100 in accordance with the present invention being coupled to a round-hole rack configuration 150 and a square-hole rack configuration 175.

Figure 5:
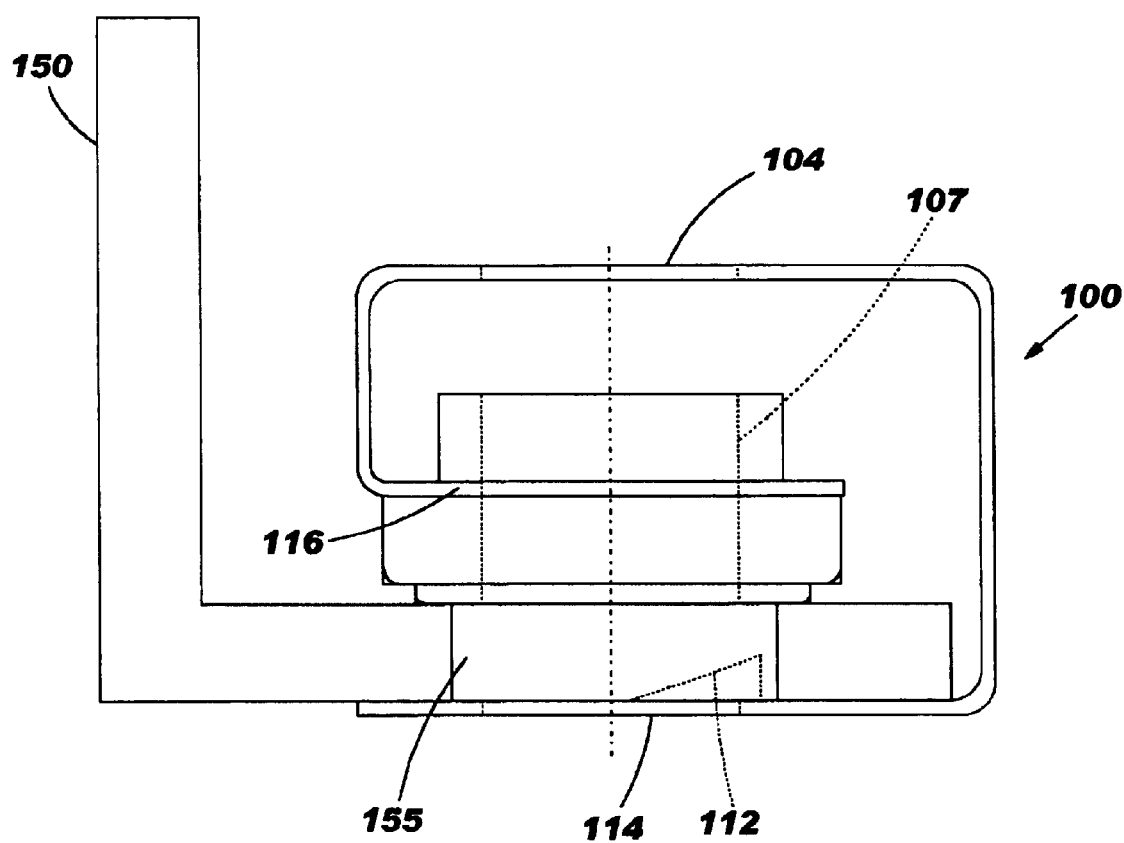
FIG. 5 is a top perspective view of how the assembly in accordance with the present invention is coupled to the round-hole rack configuration.
Figure 6:
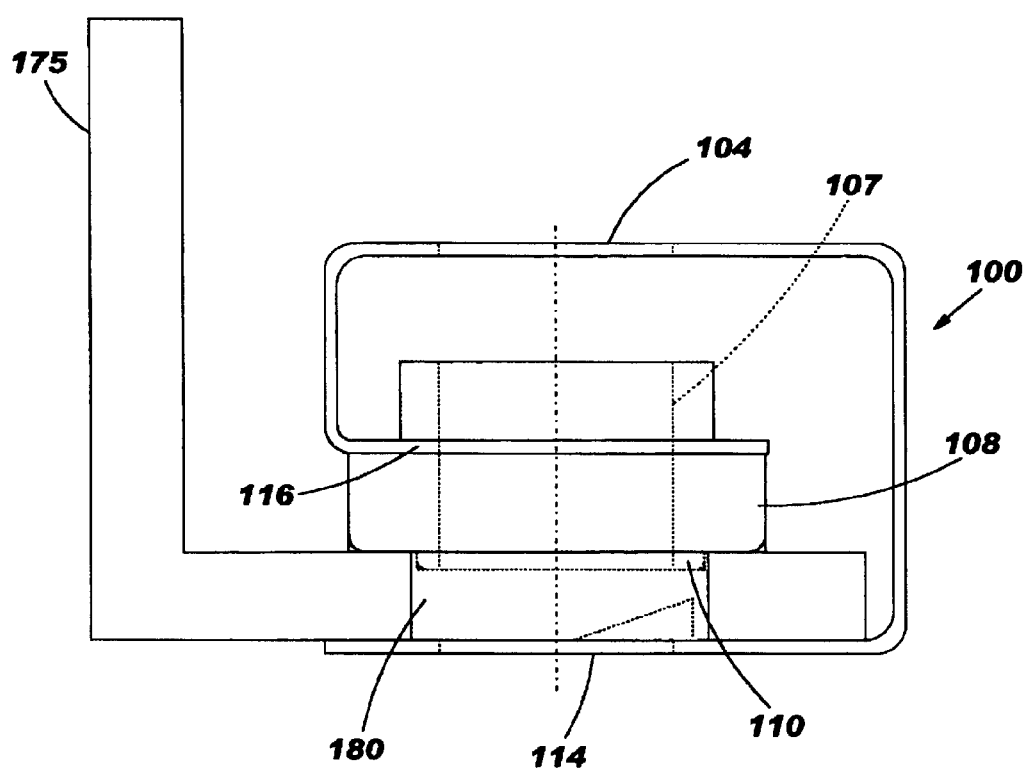
FIG. 6 is a top perspective view of how the assembly in accordance with the present invention is coupled to the square-hole rack configuration.

For a more detailed description of the present invention please refer to FIGS. 5 and 6. FIG. 5 is a top perspective view of how the assembly 100 in accordance with the present invention is coupled to the round-hole rack configuration 150. FIG. 6 is a top perspective view of how the assembly 100 in accordance with the present invention is coupled to the square-hole rack configuration 175.

Please refer now to FIG. 5. The round-hole rack configuration 150 includes at least one round hole 155. The assembly 100 is clipped to the rack configuration 150 wherein the flange element 112 is positioned along an edge of the at least one round-hole 155 to prevent the assembly 100 from becoming decoupled from the rack configuration 150. Accordingly, a threaded fastener, such as a bolt, is capable of being threadedly coupled to the rack configuration 150 via the threaded portion 107 by inserting the fastener through the anterior aperture 114, the central aperture 116 and the posterior aperture 104.

Please refer now to FIG. 6. The square-hole configuration 175 includes at least one square hole 180. The assembly 100 is clipped to the rack configuration 175 wherein the locating surface 110 acts as a positioner and fits snugly in the square hole 180 and the shoulder surface 108 is in contact with the rack configuration 175 as shown. Accordingly, a threaded fastener, such as a bolt, is capable of being threadedly coupled to the rack configuration 175 via the threaded portion 107 by inserting the fastener through the anterior aperture 114, the central aperture 116 and the posterior aperture 104.

Although the preferred embodiment of the present invention is described in the context of being utilized in conjunction with rack-mounted computer equipment, one of ordinary skill in the art will readily recognize that the present invention could be utilized with any type of rack-mounted equipment while remaining within the spirit and scope of the present invention.

Through the use of the present invention, both square-hole and round-hole rack configurations can be accommodated with one device. This results in a significant reduction in the cost of computer/rack-mounted equipment.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A clip assembly for use with rack-mounted equipment, the clip assembly comprising:

a clip element;

a threaded element coupled to the clip element, wherein the threaded element comprises a shoulder portion coupled to the clip element and a locating portion coupled to the shoulder portion, and wherein the shoulder portion separates the locating portion from the entire clip element; and a flange element coupled to the clip element, wherein both the flange element and locking portion are adapted to be received into a hole of the rack-mounted equipment.

2. The clip assembly of claim 1 wherein the threaded element further comprises a back portion coupled to the clip element.

3. The clip assembly of claim 2 wherein the shoulder portion and the back portion are coupled coaxially with a central aperture.

4. The clip assembly of claim 1 wherein the flange element is adapted to be positioned along the edge of the hole of the rack mounted equipment.

5. The clip assembly of claim 1 wherein the clip element has a first portion and a second portion, wherein the threaded element is coupled to the first portion of the clip element and the flange element is coupled to the second portion of the clip element, and wherein the first portion of the clip element separates the flange element from the threaded element.

6. The clip assembly of claim 1 wherein the clip element is configured in an "e" shape comprising a loop portion, wherein the threaded element is coupled to the loop portion.

7. The clip assembly of claim 1 wherein the locating portion is adapted to be received into a square hole of the rack mounted equipment.

* * * * *